United States Patent
Garner et al.

(10) Patent No.: US 10,827,264 B2
(45) Date of Patent: Nov. 3, 2020

(54) AUDIO PREFERENCES FOR MEDIA CONTENT PLAYERS

(71) Applicant: Roku, Inc., Los Gatos, CA (US)

(72) Inventors: Gregory Mack Garner, Springdale, AZ (US); Patrick Alan Brouillette, Tempe, AZ (US)

(73) Assignee: Roku, Inc., Los Gatos, CA (US)

( * ) Notice: Subject to any disclaimer, the term of this patent is extended or adjusted under 35 U.S.C. 154(b) by 70 days.

(21) Appl. No.: 16/148,366

(22) Filed: Oct. 1, 2018

(65) Prior Publication Data

US 2019/0037311 A1    Jan. 31, 2019

Related U.S. Application Data

(63) Continuation of application No. 14/813,628, filed on Jul. 30, 2015, now Pat. No. 10,091,581.

(51) Int. Cl.
*H04R 3/04* (2006.01)
*H04R 29/00* (2006.01)
(Continued)

(52) U.S. Cl.
CPC .............. *H04R 3/04* (2013.01); *H03G 5/025* (2013.01); *H03G 5/165* (2013.01); *H04R 29/001* (2013.01); *H04S 7/301* (2013.01); *H04R 2430/01* (2013.01); *H04S 7/307* (2013.01); *H04S 2400/13* (2013.01)

(58) Field of Classification Search
CPC .... H04R 3/04; H04R 29/001; H04R 2430/01; H03G 5/165; H03G 5/025; H04S 7/301; H04S 2400/13; H04S 7/307
See application file for complete search history.

(56) References Cited

U.S. PATENT DOCUMENTS 6,243,476 B1    6/2001  Gardner
6,606,280 B1    8/2003  Knittel
(Continued)

FOREIGN PATENT DOCUMENTS

WO    WO-2014/137740 A1    9/2014

OTHER PUBLICATIONS

International Search Report and Written Opinion of the International Searching Authority for International Application No. PCT/US2016/044053, dated Nov. 3, 2016 (10 pages).
(Continued)

*Primary Examiner* — Oyesola C Ojo
(74) *Attorney, Agent, or Firm* — Sterne, Kessler, Goldstein & Fox P.L.L.C.

(57) ABSTRACT

Disclosed herein are system, method, and tangible computer readable medium for creating a desired audio effect for a user. The method includes operations including: causing a plurality of speakers to play test signals, each test signal being specific to one of the speakers; receiving from a remote device recorded frequency responses of the speakers resulting from the playing of the test signals; creating one or more filters to match an audio profile selected by a user; applying the filters to the recorded frequency responses to obtain filtered transformations of the speakers; and transmitting the filtered transformations to the speakers; wherein the filtered transformations are applied at the speakers to thereby achieve the user audio profile.

20 Claims, 13 Drawing Sheets

(51) Int. Cl.
*H04S 7/00* (2006.01)
*H03G 5/02* (2006.01)
*H03G 5/16* (2006.01)

(56) References Cited

U.S. PATENT DOCUMENTS

| | | | |
|---|---|---|---|
| 7,848,531 B1* | 12/2010 | Vickers | H03G 7/007 |
| | | | 381/107 |
| 8,081,776 B2 | 12/2011 | Haulick et al. | |
| 8,103,008 B2* | 1/2012 | Johnston | H03G 9/005 |
| | | | 381/102 |
| 9,031,268 B2 | 5/2015 | Fejzo et al. | |
| 9,380,400 B2 | 6/2016 | Sprogis | |
| 9,385,678 B2* | 7/2016 | Galano | H03G 3/3089 |
| 9,641,952 B2 | 5/2017 | Fejzo et al. | |
| 2002/0151995 A1 | 10/2002 | Jorgenson et al. | |
| 2003/0039366 A1* | 2/2003 | Eid | H04S 3/002 |
| | | | 381/27 |
| 2005/0043831 A1* | 2/2005 | Baudisch | G06F 3/04847 |
| | | | 700/94 |
| 2006/0210097 A1* | 9/2006 | Yerrace | G06F 3/165 |
| | | | 381/119 |
| 2006/0251265 A1 | 11/2006 | Asada | |
| 2006/0285701 A1* | 12/2006 | Chumbley | G06F 3/165 |
| | | | 381/104 |
| 2007/0147636 A1 | 6/2007 | Oteki | |
| 2007/0177743 A1* | 8/2007 | Mertens | H04N 21/439 |
| | | | 381/107 |
| 2007/0225840 A1* | 9/2007 | Yahata | G11B 20/10527 |
| | | | 700/94 |
| 2008/0086312 A1* | 4/2008 | Kakuno | H04N 21/439 |
| | | | 704/500 |
| 2008/0189355 A1* | 8/2008 | Mahajan | H04L 67/125 |
| | | | 709/203 |
| 2009/0076825 A1* | 3/2009 | Bradford | H04R 25/554 |
| | | | 704/271 |
| 2009/0097665 A1* | 4/2009 | L'Esperance | H04S 7/00 |
| | | | 381/57 |
| 2009/0110218 A1 | 4/2009 | Swain | |
| 2009/0225996 A1 | 9/2009 | Brooking | |
| 2009/0232318 A1 | 9/2009 | Ohta | |
| 2011/0002471 A1 | 1/2011 | Wihardja et al. | |
| 2011/0299706 A1 | 12/2011 | Sakai | |
| 2012/0051560 A1* | 3/2012 | Sanders | H03G 7/00 |
| | | | 381/105 |
| 2012/0057725 A1* | 3/2012 | Nakamura | H04S 7/40 |
| | | | 381/104 |
| 2012/0110452 A1* | 5/2012 | Hiipakka | G06F 3/165 |
| | | | 715/716 |
| 2012/0224701 A1 | 9/2012 | Sakai et al. | |
| 2013/0142366 A1 | 6/2013 | Michael et al. | |
| 2014/0104033 A1* | 4/2014 | Griffiths | G06F 16/635 |
| | | | 340/4.3 |
| 2014/0161281 A1 | 6/2014 | Nackvi | |
| 2015/0036833 A1 | 2/2015 | Lukasczyk et al. | |
| 2015/0078596 A1 | 3/2015 | Sprogis | |
| 2015/0245153 A1* | 8/2015 | Malak | H03G 7/00 |
| | | | 381/57 |
| 2015/0382121 A1 | 12/2015 | Family et al. | |
| 2016/0198275 A1 | 7/2016 | Rabinowitz et al. | |
| 2017/0330571 A1 | 11/2017 | Komaki | |

OTHER PUBLICATIONS

Communication pursuant to Rule 164(1) EPC for European Application No. 16831241.1, dated Jan. 23, 2019 (12 pages).

* cited by examiner

AUDIO PREFERENCES FOR MEDIA CONTENT PLAYERS

RELATED APPLICATION

This application is a continuation of U.S. Nonprovisional patent application Ser. No. 14/813,628, filed on Jul. 30, 2015 and titled "Audio Preferences for Media Content Players," the contents of which are hereby incorporated herein by reference in its entirety.

FIELD OF THE INVENTION

Embodiments included herein generally relate to creating a desired listening experience for users in home entertainment systems. More particularly, embodiments relate to creating the desired listening experience for the users by use of a media remote device in conjunction with a media content player, a television and a plurality of speakers.

BACKGROUND OF THE INVENTION

When experiencing media/content having an audio component (e.g., movies, video, music, games, Internet content, etc.), different users may desire different listening experiences. For example, users may differ in their preferences for volume and other audio features (bass, treble, balance, etc.), sound mode (movie, music, surround decoder, direct playback, unprocessed, etc.), movie mode (standard, sci-fi, adventure, drama, sports, etc.), music mode (concert hall, chamber, cellar club, music video, 2 channel stereo, etc.), as well as any other audio characteristics.

Media/content such as movies, however, have a default audio track typically established by the content provider. Thus, what is needed is a way to customize the audio component of media/content to suit the listening preferences of different users.

SUMMARY OF THE INVENTION

An embodiment includes a method for creating a desired audio effect. The method operates by causing a plurality of speakers to play test signals, where each test signal is specific to one of the speakers. Frequency responses of the speakers resulting from the playing of the test signals are recorded. One or more filters matching an audio profile selected by a user is created. Then, the filters are applied to the recorded frequency responses to obtain filtered transformations of the speakers. The filtered transformations are applied at the speakers to thereby achieve the user audio profile.

Another embodiment includes a system having a media content player that is operable to cause a plurality of speakers to play test signals, where each test signal is specific to one of the speakers. Frequency responses of the speakers resulting from the playing of the test signals are recorded. The media content player creates one or more filters matching an audio profile selected by a user. The media content player applies the filters to the recorded frequency responses to obtain filtered transformations of the speakers. The filtered transformations are applied at the speakers to thereby achieve the user audio profile.

Another embodiment includes a tangible computer-readable device having instructions stored thereon that, when executed by at least one computing device, causes the computing device to perform operations comprising: causing a plurality of speakers to play test signals, each test signal being specific to one of the speakers; receiving from a remote device recorded frequency responses of the speakers resulting from the playing of the test signals; creating one or more filters to match an audio profile selected by a user; applying the filters to the recorded frequency responses to obtain filtered transformations of the speakers; and transmitting the filtered transformations to the speakers; wherein the filtered transformations are applied at the speakers to thereby achieve the user audio profile.

Another embodiment includes a method of using aggregating volume information to enhance audio playback of content. The method includes the steps of receiving requested content from a server; determining if the received content includes aggregate volume statistics; playing the received content; continuously adjusting volume of the received content based on the aggregate volume statistics, if it was determined the received content included aggregate volume statistics; monitoring changes in volume made by a user while viewing the received content; and providing information reflecting the monitored volume changes to the server.

Further features and advantages of the embodiments disclosed herein, as well as the structure and operation of various embodiments, are described in details below with reference to the accompanying drawings. It is noted that the invention is not limited to the specific embodiments described herein. Such embodiments are presented herein for illustrative purposes only. Additional embodiments will be apparent to a person skilled in the relevant art based on the teachings contained herein.

BRIEF DESCRIPTION OF THE DRAWINGS

The accompanying drawings, which are incorporated herein and form a part of the specification.

In the drawings, like reference numbers generally indicate identical or similar elements. Additionally, generally, the left-most digit(s) of a reference number identifies the drawing in which the reference number first appears.

DETAILED DESCRIPTION OF THE INVENTION

Provided herein are system, method and/or computer program product embodiments, and/or combinations and sub-combinations thereof, for creating an improved audio experience for a user.

Customizing Audio Components to Match User's Audio Profile

Figure 1:
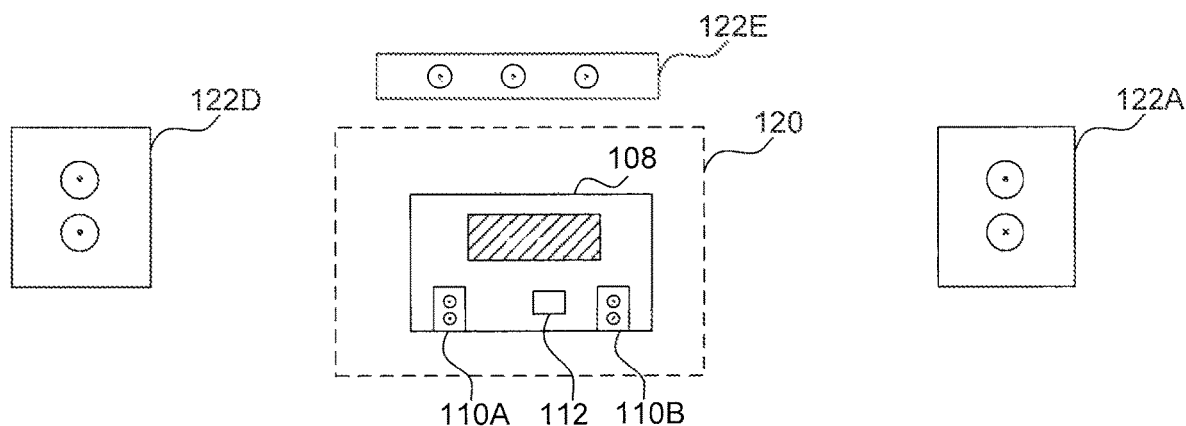
FIG. 1 illustrates a home entertainment system 100 for creating a desired audio effect for a user, according to an example embodiment.
Figure 1:
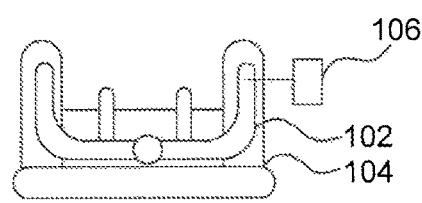
Figure 1:

FIG. 1 illustrates a home entertainment system 100 for creating an improved audio experience for a user. In an embodiment, the home entertainment system 100 is a multi-speaker home theater environment where a user 102 sits in an appropriate viewing location in chair 104 in view of media content television 108 with a media remote device 106.

Media remote device 106 may be, for example, a media player/television remote, a wireless device, a smartphone, a tablet computer, a laptop/mobile computer, a handheld computer, a server computer, an in-appliance device, a Personal Digital Assistant (PDA), or a videogame controller.

The media content television 108 may include one or more internal speakers 110, according to an embodiment. Further, the media content television 108 may include a media content player 112, according to an embodiment. The media content player 112 may be, without limitation, a streaming media player, a game console, and/or an audio/video receiver, according to example embodiments.

The home entertainment system 100 may include any number of wireless and/or wired speakers 122. In an embodiment, the wireless and/or wired speakers 122 may include front speakers, rear speakers, and a center channel speaker. In an example embodiment, the user 102 may place the speakers 122 in any location and/or configuration.

Figure 2:
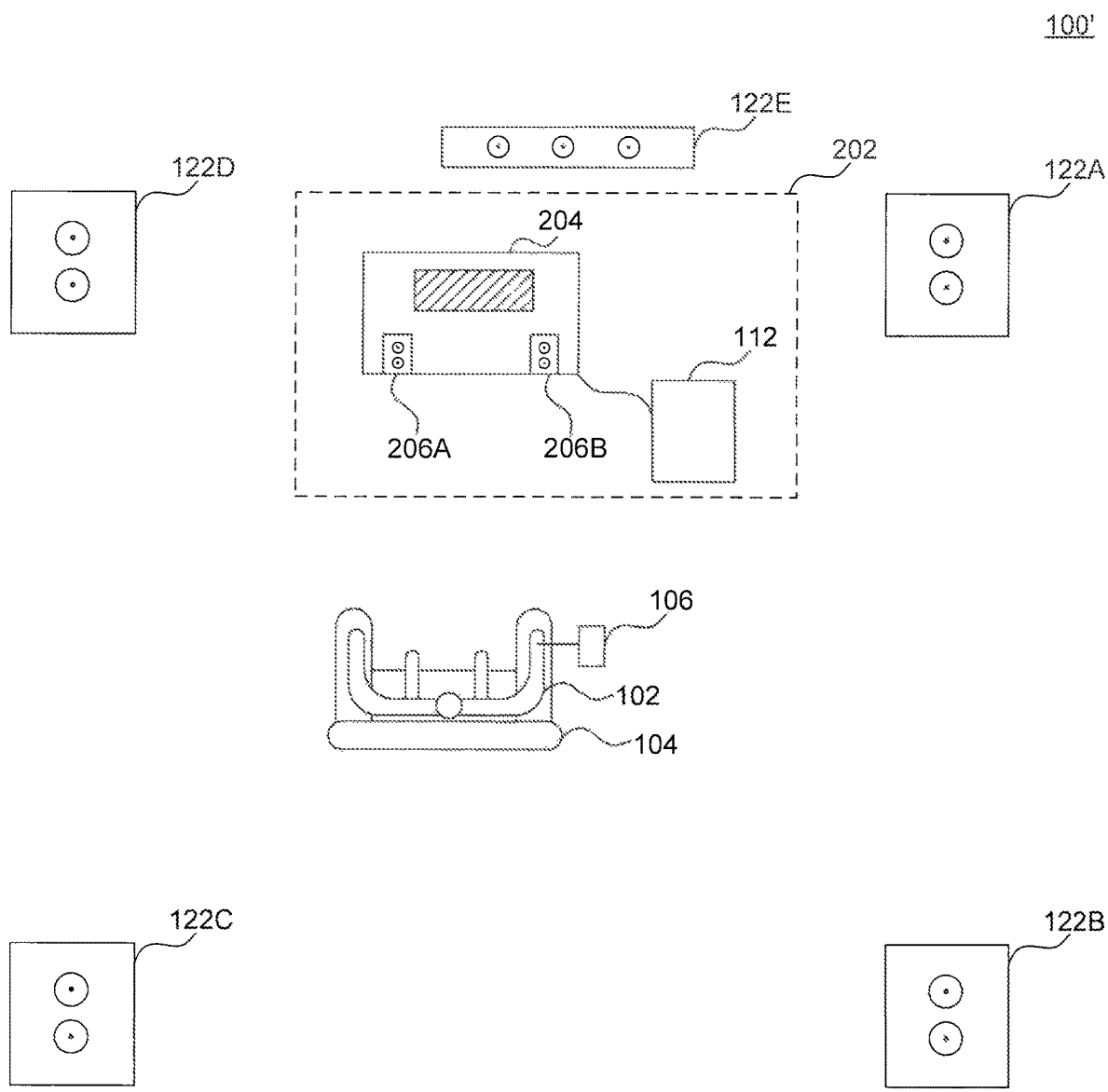
FIG. 2 illustrates a home entertainment system 100 for creating a desired audio effect for a user, according to another example embodiment.

FIG. 2 illustrates another embodiment of the home entertainment system 100. FIG. 2 is similar to FIG. 1, but shows media content player 112 as external to the television 204.

Figure 3:
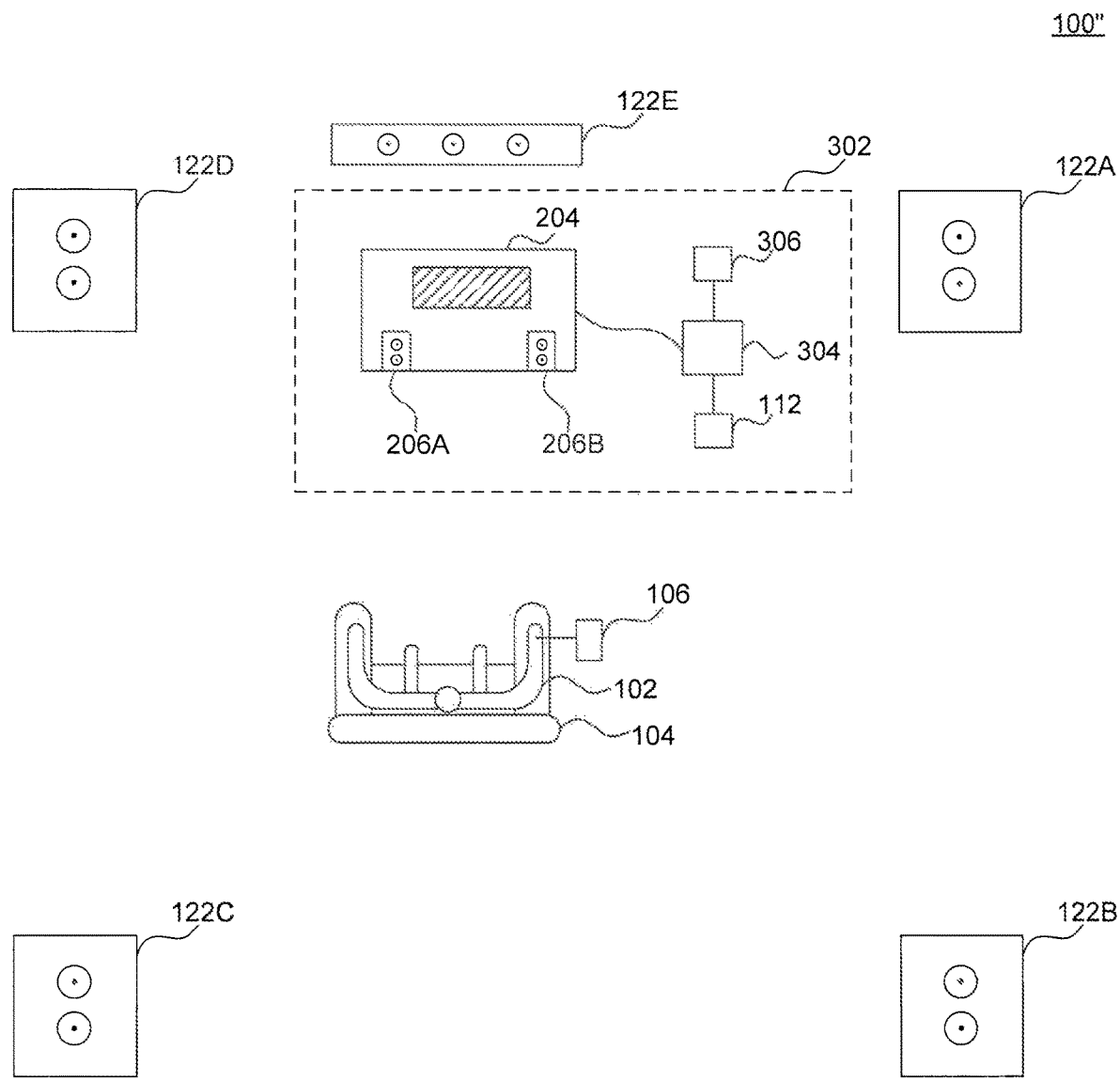
FIG. 3 illustrates a home entertainment system 100 for creating a desired audio effect for a user, according to still another example embodiment.

FIG. 3 is another embodiment of the home entertainment system 100. FIG. 3 is similar to FIG. 1, but includes additional components in media entertainment system 302.

In particular, in the example of FIG. 3, media content player 112 is connected to a stereo 304. The audio and video output of stereo 304 may be connected to television 204. A line out of stereo 304 may be a non-amplified signal output port connected to a cascaded device 306 for sound enhancements, according to an example embodiment. The cascaded device 306 may transmit its output to wireless and/or wired speakers 122, according to an embodiment. The cascaded device 306 may include but not be limited to a preamplifier, an equalizer device, a microphone, a speaker, a tablet computer, a personal desktop, a laptop/mobile computer, a handheld computer, a server computer, or an in-appliance device, according to example embodiments.

Figure 4:
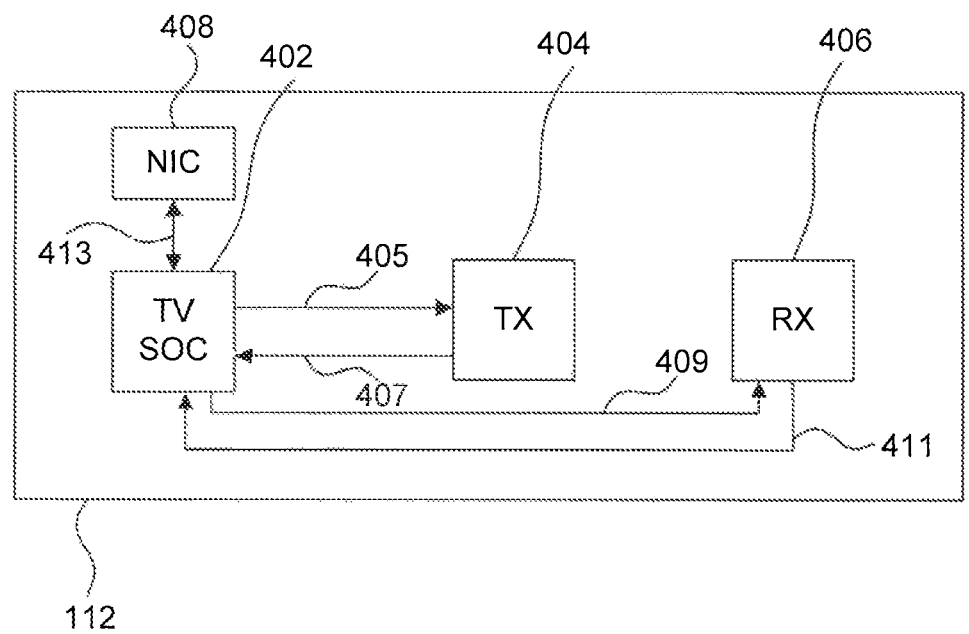
FIG. 4 illustrates a media content player, according to an example embodiment.

FIG. 4 illustrates media content player 112, according to an example embodiment. The media content player 112 may include a TV System on a Chip (TV SOC) 402, a transmitter 404, a receiver 406, and a Network Interface Circuit (NIC) 408. According to an embodiment, the TV SOC 402 communicates with the transmitter 404 and the receiver 406. The TV SOC 402 may be configured to receive video streaming from NIC 408 and integrate high efficiency video codec to the received video streaming, according to an embodiment. The TV SOC 402 may use a High Efficiency Video Codec (HEVC) or H.265 standard. The TV SOC 402 may transmit the integrated video to television 204 or to the media content television 108.

Figure 5:
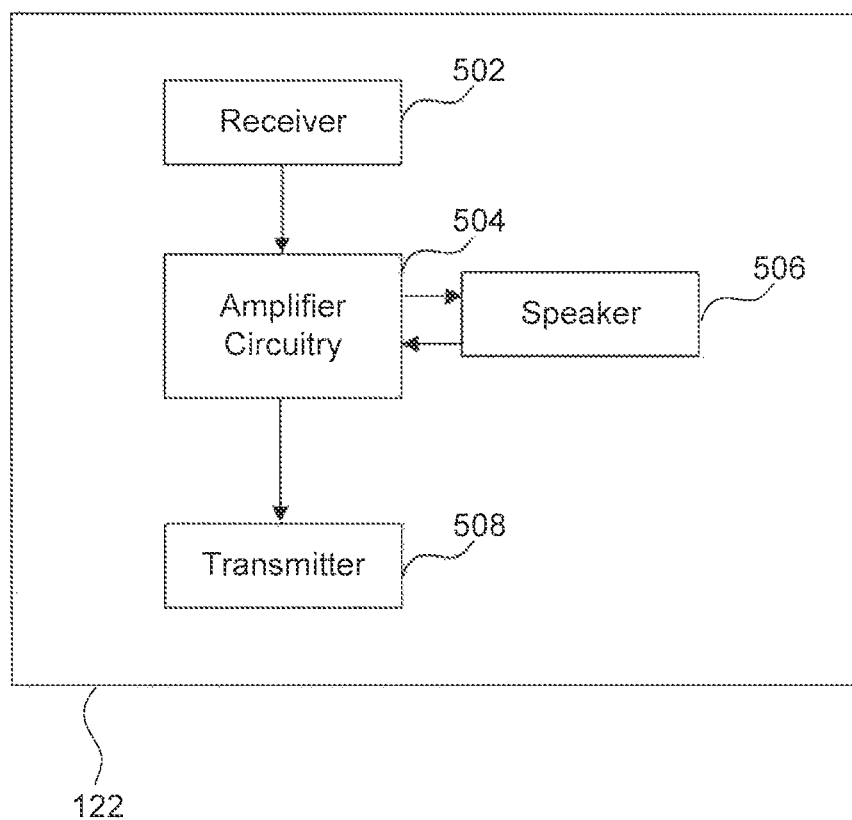
FIG. 5 illustrates a wireless and/or wired speaker, according to an example embodiment.

FIG. 5 illustrates wireless and/or wired speakers 122, according to an example embodiment. The wireless and/or wired speakers 122 may include a receiver 502, amplifier circuitry 504, a speaker 506, and a transmitter 508.

Figure 6:
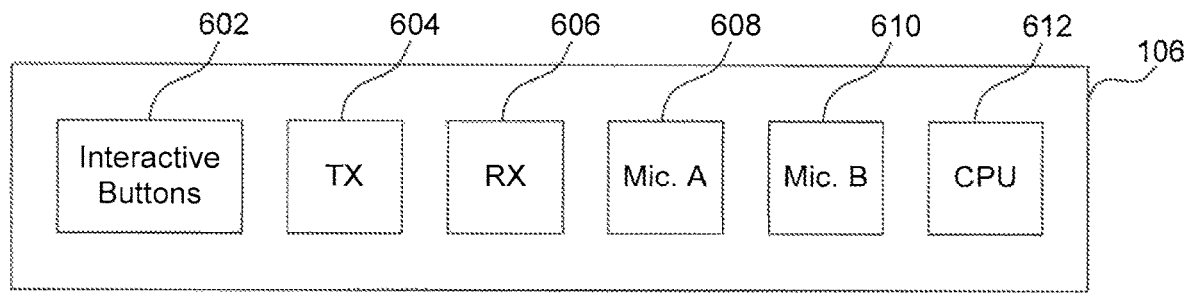
FIG. 6 illustrates a media remote device, according to an example embodiment.

FIG. 6 illustrates a media remote device 106, according to an example embodiment. The media remote device 106 may include interactive buttons 602 (e.g., volume, channel, up-down-left-right arrows, select, menu, etc.), a transmitter 604, a receiver 606, a microphone A 608, a microphone B 610, and a Central Processing Unit (CPU) 612.

According to an embodiment, microphone A 608 is configured to receive human voice and has a frequency response range of 300 Hertz (Hz) to 3000 Hz. Microphone B 610 is configured to receive background noise and has a frequency response range of 20 Hz to 20 kilohertz (kHz). CPU 612 operates to discern between audio voices and background noises received by microphone A 608 and microphone B 610.

Figure 9:
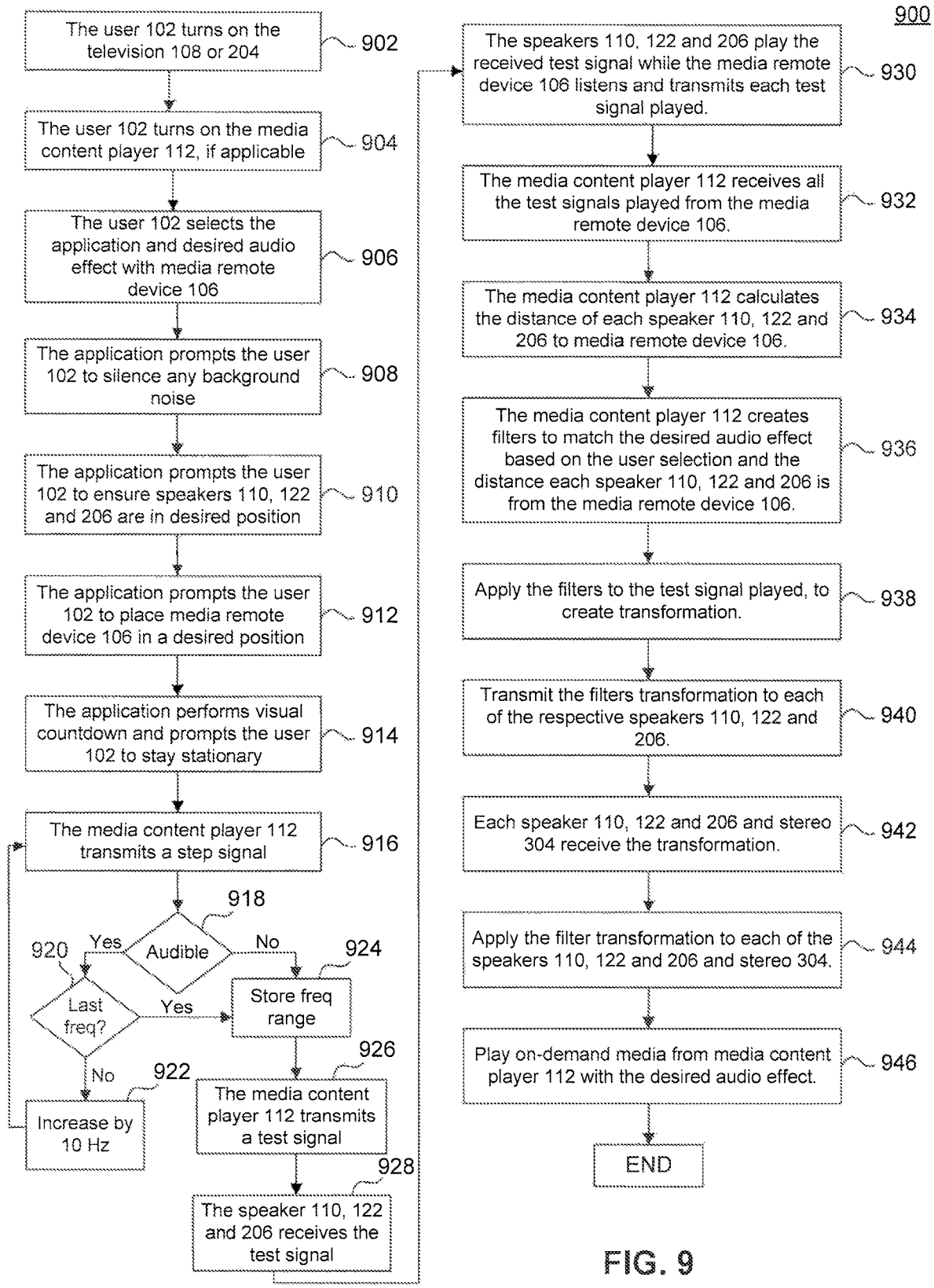
FIG. 9 is a flowchart for creating a desired audio effect for a user, according to an example embodiment.

FIG. 9 is a method 900 for creating a desired audio experience for a user, according to an example embodiment. Method 900 can be performed using, for example, system 100 of FIGS. 1-3.

Generally, method 900 operates to configure the components of system 100 so as to customize the audio experience for user 102. First, system 100 determines the user 102's audio preferences (this is generally covered by steps 902-908). Second, system 100 determines the current audio response of the components of system 100 (this is generally covered by steps 910-934). Third and finally, system 100 modifies the audio response of the components of system 100 so as to align such audio response with the user 102's audio preferences (this is generally covered by steps 936-946). Method 900 shall now be described in detail.

In steps 902 and 904, user 102 turns on the television 108/204 and media content player 112 (in an embodiment, media content player 112 will automatically turn on when the television 108/204 turns on, if these components are integrated into a single unit as shown in FIG. 1).

In step 906, the user 102 uses remote 106 to communicate with media content player 112 and set his audio preferences. In an embodiment, the media content player 112 displays a series of menus on television 108/204 to enable the user 102 to select and define a plurality of audio effects. Such audio effects include but are not limited to: delay between front and back speakers; delay between right and left speakers; volume and other audio features (bass, treble, balance, midrange, fading, etc.); sound mode (movie, music, surround decoder, direct playback, unprocessed, etc.); movie mode (standard, sci-fi, adventure, drama, sports, etc.); music mode (concert hall, chamber, cellar club, music video, 2 channel stereo, etc.); as well as any other audio characteristics. The media content player 112 saves the user 102's audio preferences (which are also called the user 102's audio profile).

In an embodiment, the user 102 may define different audio profiles for different types of content, such as different types of movies (e.g., action, drama, comedies, etc.), different types of music (e.g., pop, country, alternative, etc.), different types of venues (e.g., stadium, concert hall, intimate night club, etc.), different types of technical features (subwoofer on/off; rear speakers on/off; 2 channel mono; etc.), as well as any other combination of audio features the user 102 may wish to define.

Also in step 906, user 102 selects one of his audio profiles.

The room in which the user 102 is seated may include acoustic anomalies, such as room configuration or furniture that affect acoustics. Also, the acoustic anomalies may include the frequency response of speakers 110, 122 and 206, as well as the frequency response of the interaction between speakers 110, 122 and 206. Another acoustic anomaly may be coupling, reflections, or echoes from interaction between speakers 110, 122 and 206 and the walls of the home entertainment system 100. An additional acoustic anomaly may be audio effects caused by dynamic conditions of temperature, humidity and changing absorption.

These acoustic anomalies may not be detected by media content player 112 if background noise is present. Thus, in step 908, media content player 112 prompts the user 102 to silence any background noise. Also, media content player 112 turns off any background noise reduction algorithms in components of system 100.

In step 910, media content player 112 prompts the user 102 to ensure the speakers 110, 122, 206 and stereo 304 are placed in their desired position. In an embodiment, user 102 can place speakers 110, 122, 206 and stereo 304 in any desired location and configuration. In the following steps, regardless of the location of speakers 110, 122, 206 or stereo 304, media content player 112 will accordingly adjust the operation of components of system 100 to achieve the user 102's selected audio profile.

In step 912, media content player 112 prompts the user 102 to place the media remote device 106 in the desired position. In an embodiment, the desired position of remote 106 is where the user 102 will normally sit (i.e., chair 104).

In step 914, media content player 112 may instruct the user 102 to remain stationary. Media content player 112 also may instruct user 102 to keep the remote 106 stationary. Having both the user 102 and remote 106 stationary during the following steps may enhance the ability of media content player 112 to achieve the user 102's selected audio profile.

As people age, gradual hearing loss may occur. In an embodiment, media content player 112 may compensate for such hearing degradation. Accordingly, in step 916, media content player 112 transmits a tone to test the audible hearing frequency range of user 102. Media content player 112 may transmit tones stepping in increments of frequency until the tones are no longer audible. The process for transmitting tones may begin with transmitting the tone at the lowest frequency, according to an embodiment. In an alternative embodiment, the tone may begin with transmitting the tone at the highest frequency.

In step 918, media content player 112 asks the user 102 if the tone was audible. If user 102 answers "Yes" via the remote 106, then in step 920 the media content player 112 determines if the last transmitted tone was at the maximum allowable frequency. If not, then in step 922 the frequency is increased by some increment (such as 10 Hz in a non-limiting example), and in step 916 the tone at the higher frequency is transmitted.

If at step 918 the user 102 answered "No," then in step 924 the media content player 112 stores the maximum audible frequency in the user 102's audio profile. In an embodiment, media content player 112 uses the maximum audible frequency as a threshold for user 102. Specifically, in an embodiment, media content player 112 may not play sounds above the maximum audible frequency when the user 102's selected audio profile is being used.

In step 926, media content player 112 transmits a test signal from transmitter 404 to speakers 110, 122 and 206. In an embodiment, media content player 112 may send a different test signal to different speakers 110, 122 and 206.

Figure 7:
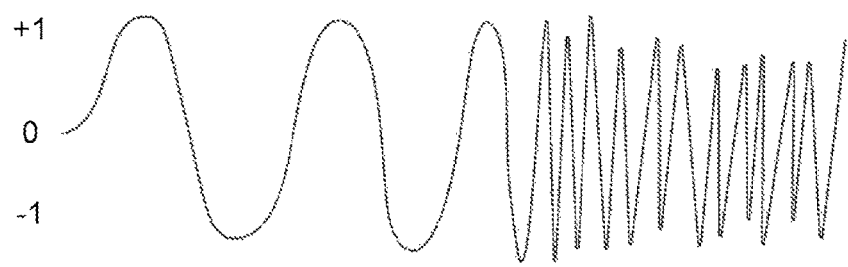
FIG. 7 illustrates an example chirp waveform.
Figure 8:
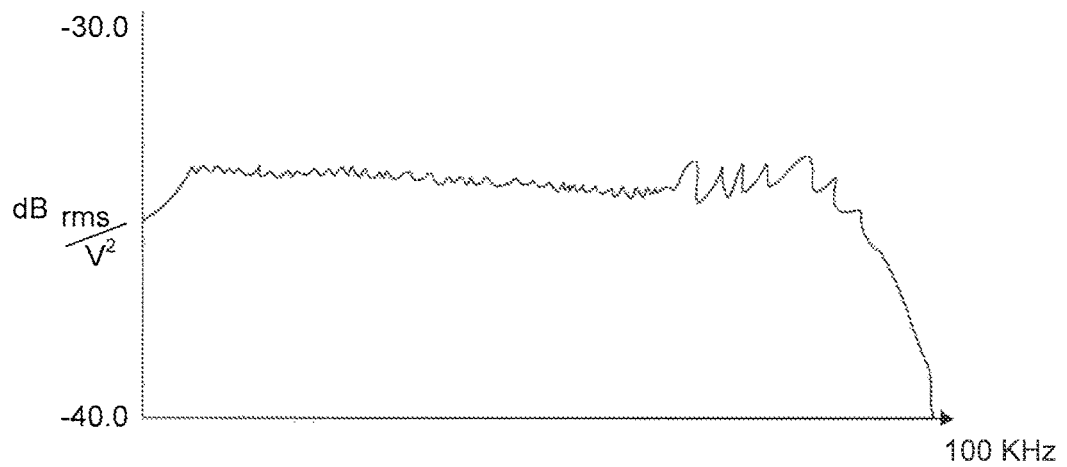
FIG. 8 illustrates an example frequency response of a chirp waveform.

In step 928, speakers 110, 122 and 206 receive the test signal(s) via their respective receiver 502. According to an embodiment, the test signal may include a chirp signal, an example of which is shown in FIG. 7. A chirp signal is a sinusoid that sweeps rapidly from a starting frequency to an end frequency. The chirp waveform may range in amplitude from +1 volt to −1 volt. A desirable feature of the chirp waveforms is its small crest factor and flat frequency response. The flat frequency response of the chirp signal, as shown in FIG. 8, is used to equally test all frequency components of a system.

In an alternative embodiment, the test signal may include a step signal. A step signal may be useful to evaluate the transient response of a system under test.

In step 930, speakers 110, 122 and 206 play their respective test signal. In an embodiment, for each speaker 110, 122 and 206, amplifier circuitry 504 plays the test signal via speaker 506. In an embodiment, speakers 110, 122, and 206 sequentially play the received test signal. Alternatively, the speakers 110, 122 and 206 play the test signal at the same time.

Also in step 930, the remote 106 receives the test signal played by speakers 110, 122 and 206 via microphone A 608 and microphone B 610. In doing so, remote 106 processes and/or records the frequency response of speakers 110, 122 and 206. Where the test signals differ by speaker 110, 122 and 206, remote 106 also timestamps when it received the test signal from each speaker 110, 122 and 206.

In step 932, media content player 112 receives the recorded frequency responses of speakers 110, 122 and 206 from media remote device 106. Media content player 112 also receives from remote 106 the timestamps (when available).

In step 934, media content player 112 calculates the respective distances of the remote 106 to each of the speakers 110, 122, and 206. In an embodiment, media content player 112 calculates these distances based on the delay of the test signal between when the test signals were issued by media content player 112 (in step 926) and heard by remote 106 (in step 930). In an embodiment, because speakers 110, 122 and 206 were assigned different test signals, media content player 112 is able to calculate the distance for each.

In step 936, media content player 112 creates a filter(s) for the selected audio profile. The filter(s) may take into consideration the respective frequency responses (from step 930) and distances (from step 934) of the speakers 110, 122 and 206. As discussed below, the filter(s) will operate to transform the frequency response of each speaker 110, 122 and 206 to the user 102's selected audio profile. According to an embodiment, media content player 112 generates a linear time invariant (LTI) filter for the selected audio profile. The LTI filter is generated based on a frequency response of the selected audio profile (or each component thereof) and will be respectively convolved with the recorded frequency response of speakers 110, 122 and 206. In doing so, media content player 112 strives to modify the frequency response of speakers 110, 122 and 206 to match the user 102's selected audio profile. In an embodiment, media content player 112 may also strive to eliminate unwanted frequency components in the recorded frequency responses of speakers 110, 122 and 206. Such unwanted frequency components may be the result of acoustic anomalies discussed above.

Embodiments may use two types of LTI filters, Finite Impulse Response (FIR) filters and/or Infinite Impulse Response (IIR) filters. An advantage of using a FIR filter is its ability to reduce or eliminate phase distortion. As such, a FIR filter may be generated by the media content player 112 to reduce or eliminate phase adjustments. Alternatively, a FIR filter may be designed to create particular desired phase adjustments. For example, the FIR filter may be designed for the theater environment audio effect, where a phase adjustment of around 70 degrees may be desirable. An advantage of an IIR filter is it may be more computationally efficient.

In another embodiment, media content player 112 may generate a combination of IIR and FIR filters for each speaker 110, 122 and 206 in step 436.

Also, in step 936, media content player 112 may generate filters to compensate for delays associated with the distance of speakers 110, 122 and 206 determined in step 934.

In step 938, media content player 112 applies the filters to the frequency responses of speakers 110, 122 and 206 to create a filter transformation for each of the speakers 110, 122 and 206.

In step 940, media content player 112 transmits the filter transformations to their respective speakers 110, 122 and 206, as well as to stereo 304.

In step 942, speakers 110, 122 and 206 and stereo 304 respectively receive the filter transformations.

In step 944, the filter transformations are applied to each of the speakers 110, 122 and 206 and the stereo 304. In an embodiment, each speaker 110, 122 and 206 processes and applies the received filter transformation with amplifier circuitry 504. In an alternative embodiment, the filter transformations may be applied by stereo 304. In an embodiment, the stereo 304 may apply the filter transformations to the line out which is connected to the cascaded device 306.

In step 946, user 102 selects content from the media content player 112. In response, media content 112 plays the content on television 108/204 using the selected audio profile in the manner discussed above.

Crowd-Sourcing Volume Information for Enhanced Playback of Content

Figure 10:
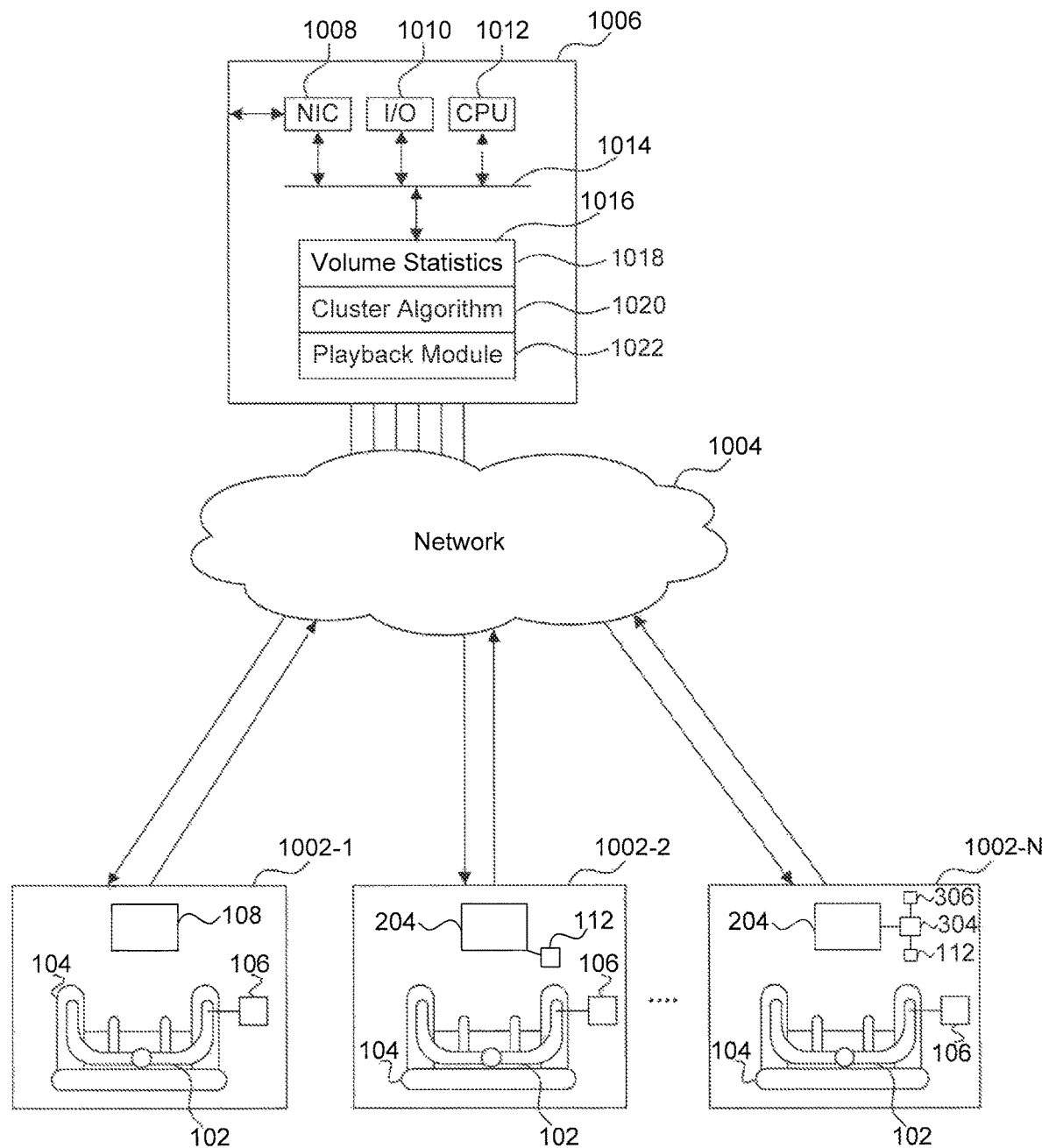
FIG. 10 illustrates a network environment 1000 for analyzing volume statistics for users, according to an example embodiment.

In another aspect of embodiments of the invention, FIG. 10 illustrates a network environment for analyzing and applying volume statistics for users 102. The system 1000 includes a set of environments 1002-1 through 1002-N, a network 1004, and an aggregate server 1006, according to an embodiment. Each environment 1002-1 through 1002-N includes a user 102 with a television 108/204 and media content player 112, similar to that shown in FIGS. 1-3. Media content players 112 are configured to access aggregate server 1006 as described below. In an embodiment, aggregate server 1006 includes network interface circuit (NIC) 1008, an input/output (I/O) device 1010, a central processing unit (CPU) 1012, a bus 1014, and a memory 1016.

As further described below, users 102 experience media/content using media content players 112. In doing so, users 102 use remotes 106 to change the volume level. In an embodiment, media content players 112 monitor and record volume levels of users 102 and correlate these volume levels with the content being watched. Media content players 112 upload these volume statistics 1018 to aggregate server 1006. Later, when a user 102 wishes to view content, the associated media content player 112 may access volume statistics 1018 of that content from aggregate server 1006. If any volume statistics 1018 exist, media content play 112 may download and apply the volume statistics 1018 while presenting the content to the user 102.

In an embodiment, volume statistics 1018 for a given media/content may vary by time of day. For example, the volume may be lower late at night relative to early evening. Accordingly, aggregate server 1006 may store volume statistics 1018 for a given content based on time of day. Aggregate server 1006 may also select and provide volume statistics 1018 to media content player 112 based on time of day.

Memory 1016 of aggregate server 1006 may include a cluster algorithm 1020, according to an embodiment. The cluster algorithm 1020 causes CPU 1012 to process volume statistics 1018. Such volume statistics 1018 may include N sections of volume statistics 1018 for a particular media for each of environments 1002-N. These volume statistics 1018 may be aggregated to form a crowd sourced repository of volume level changes associated with different points in time in the playback of media.

Figure 11:
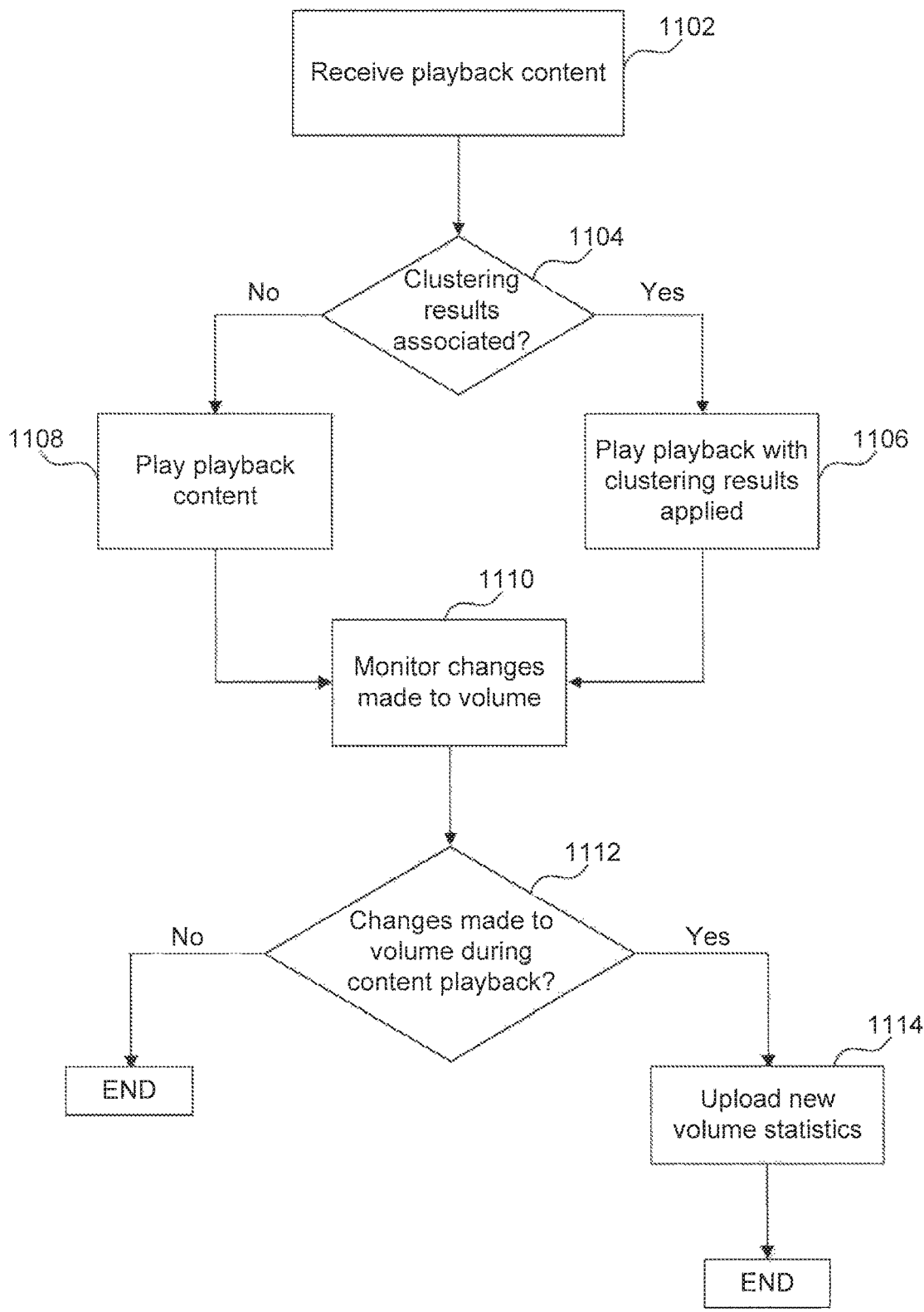
FIG. 11 is a flowchart for monitoring, recording and transmitting volume statistics for users, according to an example embodiment.

FIG. 11 is a method 1100 for monitoring, recording, and applying volume statistics for user 102, according to an example embodiment.

In step 1102, media content player 112 may receive media from aggregate server 1006 or some other source, according to an example embodiment.

In step 1104, media content player 112 may check whether the received media includes volume statistics 1018. If yes, then in step 1106 media content player 112 plays the received media on television 108/204 and, while doing so, continually adjusts the volume according to the received volume statistics 1018. If not, then in step 1108 media content player 112 plays the received media using the audio information included therein. Alternatively, media content player 112 may request volume statistics 1018 from aggregate server 1006 and then perform step 1106 upon receipt.

In step 1110, while playing the received media, media content player 112 monitors and records as the user 102 changes the volume level. Media content player 112 correlates any volume changes to the portions of the media being viewed at the time the volume changes were made.

If volume changes were made (as determined in step 1112), then in step 1114 media content player 112 uploads that volume information to aggregate server 1006.

Figure 12:
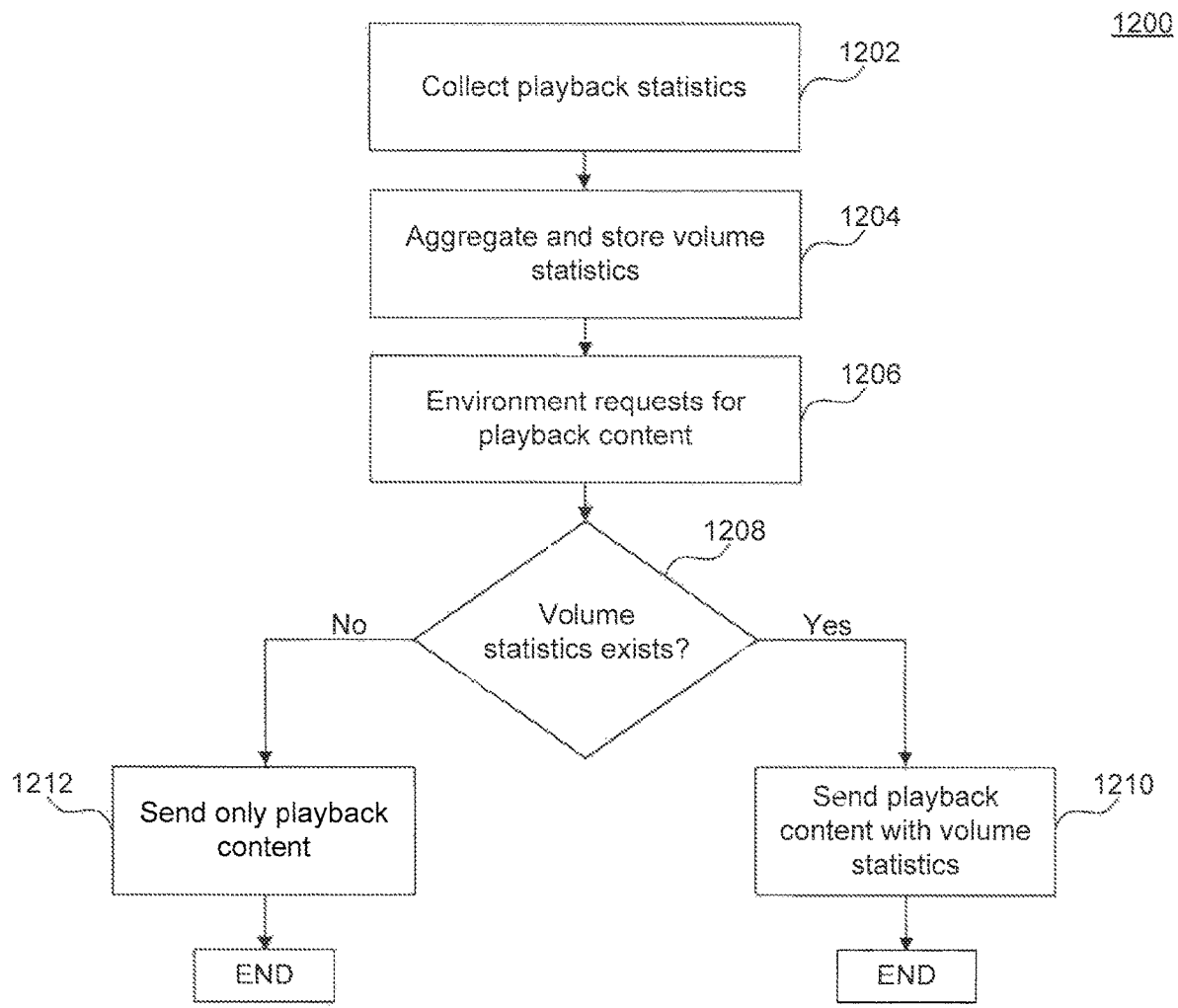
FIG. 12 is a flowchart for analyzing volume statistics for users, according to an example embodiment.

FIG. 12 is a method 1200 for analyzing volume statistics, according to an example embodiment.

In step 1202, aggregate server 1006 receives volume statistics from media content players 112. The volume statistics are mapped to portions of media that were being viewed when volume changes took place.

In step 1204, aggregate server 1006 aggregates and stores the aggregated volume statistics 1018. In an embodiment, aggregate server 1006 aggregates by organizing and averaging volume information by media timeline. For example, assume aggregate server 1006 receives information reflecting multiple volume changes at time t5 of a given content. In an embodiment, aggregate server 1006 averages those volume changes to generate the aggregate volume information 1018 for time t5 of that given content.

In step 1206, media content player 112 requests content.

In step 1208, aggregate server 1006 determines if volume statistics 1018 exist for the requested content. If yes, then in step 1210 aggregate server 1006 provides such volume statistics 1018 to media content player 112. Aggregate server 1006 may also provide the requested content to media content player 112.

Otherwise, in step 1212 aggregate server 1006 may provide only the requested content to the media content player 112.

Example Computer System

Figure 13:
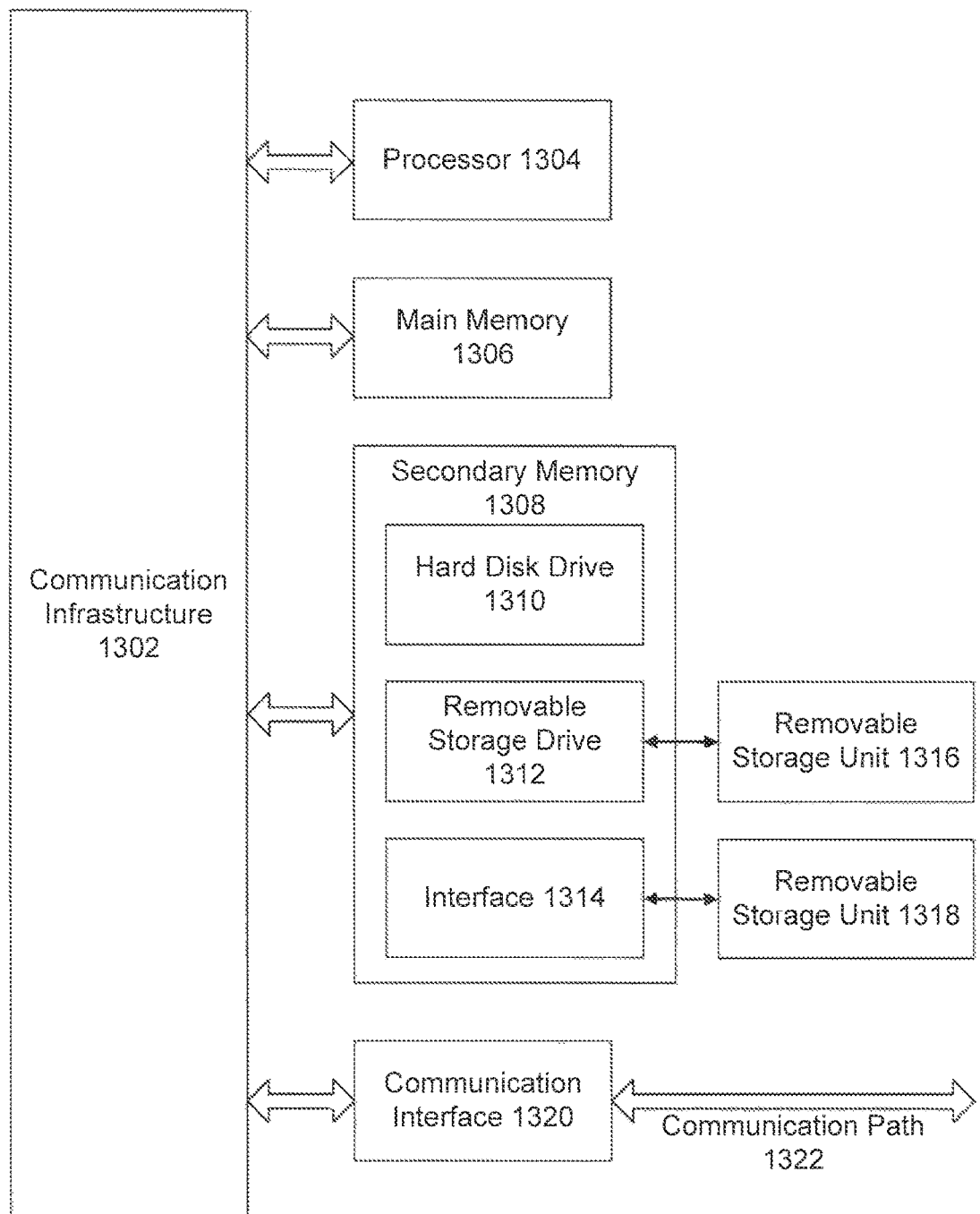
FIG. 13 is an example computer system useful for implementing various embodiments.

Various embodiments can be implemented, for example, using one or more well-known computer systems, such as computer system 1300 shown in FIG. 13. Computer system 1300 can be any well-known computer capable of performing the functions described herein, such as computers available from International Business Machines, Apple, Sun, HP, Dell, Sony, Toshiba, etc.

Computer system 1300 includes one or more processors (also called central processing units, or CPUs), such as a processor 1304. Processor 1304 is connected to a communication infrastructure or bus 1306.

Computer system 1300 also includes user input/output device(s) 1303, such as monitors, keyboards, pointing devices, etc., which communicate with communication infrastructure 1306 through user input/output interface(s) 1302.

Computer system 1300 also includes a main or primary memory 1308, such as random access memory (RAM). Main memory 1308 may include one or more levels of cache. Main memory 1308 has stored therein control logic (i.e., computer software) and/or data.

Computer system 1300 may also include one or more secondary storage devices or memory 1310. Secondary memory 1310 may include, for example, a hard disk drive 1312 and/or a removable storage device or drive 1314. Removable storage drive 1314 may be a floppy disk drive, a magnetic tape drive, a compact disk drive, an optical storage device, tape backup device, and/or any other storage device/drive.

Removable storage drive 1314 may interact with a removable storage unit 1318. Removable storage unit 1318 includes a computer usable or readable storage device having stored thereon computer software (control logic) and/or data. Removable storage unit 1318 may be a floppy disk, magnetic tape, compact disk, DVD, optical storage disk, and/any other computer data storage device. Removable storage drive 1314 reads from and/or writes to removable storage unit 1318 in a well-known manner.

According to an exemplary embodiment, secondary memory 1310 may include other means, instrumentalities or other approaches for allowing computer programs and/or other instructions and/or data to be accessed by computer system 1300. Such means, instrumentalities or other approaches may include, for example, a removable storage unit 1322 and an interface 1320. Examples of the removable storage unit 1322 and the interface 1320 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 1300 may further include a communication or network interface 1324. Communication interface 1324 enables computer system 1300 to communicate and interact with any combination of remote devices, remote networks, remote entities, etc. (individually and collectively referenced by reference number 1328). For example, communication interface 1324 may allow computer system 1300 to communicate with remote devices 1328 over communications path 1326, which may be wired and/or wireless, and which may include any combination of LANs, WANs, the Internet, etc. Control logic and/or data may be transmitted to and from computer system 1300 via communication path 1326.

In an embodiment, a tangible apparatus or article of manufacture comprising a tangible computer useable or readable medium having control logic (software) stored thereon is also referred to herein as a computer program product or program storage device. This includes, but is not limited to, computer system 1300, main memory 1308, secondary memory 1310, and removable storage units 1318 and 1322, as well as tangible articles of manufacture embodying any combination of the foregoing. Such control logic, when executed by one or more data processing devices (such as computer system 1300), causes such data processing devices to operate as described herein.

Based on the teachings contained in this disclosure, it will be apparent to persons skilled in the relevant art(s) how to make and use the invention using data processing devices, computer systems and/or computer architectures other than that shown in FIG. 13. In particular, embodiments may operate with software, hardware, and/or operating system implementations other than those described herein.

CONCLUSION

It is to be appreciated that the Detailed Description section, and not the Summary and Abstract sections (if any), is intended to be used to interpret the claims. The Summary and Abstract sections (if any) may set forth one or more but not all exemplary embodiments of the invention as contemplated by the inventor(s), and thus, are not intended to limit the invention or the appended claims in any way.

While the invention has been described herein with reference to exemplary embodiments for exemplary fields and applications, it should be understood that the invention is not limited thereto. Other embodiments and modifications thereto are possible, and are within the scope and spirit of the invention. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the invention should not be limited by any of the above-described exemplary embodiments, but should be defined only in accordance with the following claims and their equivalents.

What is claimed is:

1. A method performed by a media content device for using aggregate volume statistics to enhance audio playback of media content, comprising:

providing a request to a server for the media content;
receiving the media content from the server;
determining if the media content includes the aggregate volume statistics, wherein the aggregate volume statistics reflect a plurality of volume changes provided by a plurality of media content devices;
playing the media content;
continuously adjusting a volume level of the media content based on the aggregate volume statistics responsive to determining that the media content includes the aggregate volume statistics;
correlating a change in the volume level made at a specific portion of the media content while playing the media content; and
providing information reflecting the change in the volume level to the server.

2. The method of claim 1, wherein the information includes time information associated with portions of the media content.

3. The method of claim 2, wherein the time information includes a mapping between the volume level and the specific portion of the media content.

4. The method of claim 2, wherein the time information includes an average volume for a specific portion of the media content, wherein the average volume is based on a plurality of volume changes for the specific portion.

5. The method of claim 1, wherein the aggregate volume statistics are provided from the server to the media content device based on a time period of the request.

6. The method of claim 1, wherein the aggregate volume statistics include an average volume for the specific portion of the media content based on the plurality of volume changes for the specific portion.

7. The method of claim 1, wherein, responsive to determining that the media content does not include the aggregate volume statistics, playing the media content without adjusting the volume level based on the aggregate volume statistics.

8. A media content device for using aggregate volume statistics to enhance audio playback of media content, comprising:
a processor operable to:
provide a request to a server for the media content;
receive the media content from the server;
determine if the media content includes the aggregate volume statistics, wherein the aggregate volume statistics reflect a plurality of volume changes provided by a plurality of media content devices;
play the media content;
continuously adjust a volume level of the media content based on the aggregate volume statistics responsive to determining that the media content includes the aggregate volume statistics;
correlate a change in the volume level made at a specific portion of the media content while playing the media content; and
provide information reflecting the change in the volume level to the server.

9. The media content device of claim 8, wherein the information includes time information associated with portions of the media content.

10. The media content device of claim 9, wherein the time information includes a mapping between the volume level and the specific portion of the media content.

11. The media content device of claim 9, wherein the time information includes an average volume for a specific portion of the media content, wherein the average volume is based on the plurality of volume changes for the specific portion of the media content.

12. The media content device of claim 8, wherein the aggregate volume statistics are provided from the server to the media content device based on a time period of the request.

13. The media content device of claim 8, wherein the aggregate volume statistics include an average volume for a specific portion of the media content based on the plurality of volume changes for the specific portion of the media content.

14. A non-transitory, tangible computer-readable device having instructions stored thereon that, when executed by at least one computing device, causes the at least one computing device to perform operations comprising:
receiving a request for media content, wherein the media content includes aggregate volume statistics;
providing to a media content device the media content, wherein the media content is configured to allow the media content device to continuously adjust a volume level of the media content based on the aggregate volume statistics;
receiving from the media content device information reflecting changes in the volume level to the server, wherein the changes were made while playing the media content;
receiving, from a second media content device, second information reflecting second changes to a second volume level of the media content made while playing the media content on the second media content device; and
updating the aggregate volume statistics based on the information and the second information.

15. The non-transitory, tangible computer-readable device of claim 14, wherein the information includes time information associated with portions of the media content.

16. The non-transitory, tangible computer-readable device of claim 15, wherein the time information includes a mapping between a volume level and a specific portion of the media content.

17. The non-transitory, tangible computer-readable device of claim 15, wherein the time information includes an average volume for the specific portion of the media content, wherein the average volume is based on a plurality of volume changes for the specific portion of the media content.

18. The non-transitory, tangible computer-readable device of claim 14, wherein the aggregate volume statistics are provided from the server to the media content device based on a time period of the request.

19. The non-transitory, tangible computer-readable device of claim 14, wherein the aggregate volume statistics include an average volume for a specific portion of the media content based on a plurality of volume changes for a specific portion of the media content.

20. The non-transitory, tangible computer-readable device of claim 19, wherein the plurality of volume changes are provided by a plurality of media content devices.

* * * * *